(12) United States Patent
Miki et al.

(10) Patent No.: US 9,077,358 B2
(45) Date of Patent: Jul. 7, 2015

(54) SUCCESSIVE APPROXIMATION AD CONVERTER AND NOISE GENERATOR

(71) Applicant: PANASONIC CORPORATION, Osaka (JP)

(72) Inventors: Takuji Miki, Kyoto (JP); Kazuo Matsukawa, Osaka (JP); Takashi Morie, Osaka (JP); Shiro Sakiyama, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 82 days.

(21) Appl. No.: 14/300,657

(22) Filed: Jun. 10, 2014

(65) Prior Publication Data

US 2014/0285370 A1    Sep. 25, 2014

Related U.S. Application Data

(63) Continuation of application No. PCT/JP2012/007794, filed on Dec. 5, 2012.

(30) Foreign Application Priority Data

Dec. 28, 2011    (JP) ................................. 2011-287433

(51) Int. Cl.

| H03M 1/12 | (2006.01) |
|---|---|
| H03M 1/08 | (2006.01) |
| H03M 1/06 | (2006.01) |
| H03M 1/80 | (2006.01) |
| H03M 1/00 | (2006.01) |
| H03M 3/00 | (2006.01) |
| H03M 1/46 | (2006.01) |

(52) U.S. Cl.
CPC ................ *H03M 1/08* (2013.01); *H03M 1/804* (2013.01); *H03M 1/00* (2013.01); *H03M 3/30* (2013.01); *H03M 1/12* (2013.01); *H03M 1/0641* (2013.01); *H03M 1/466* (2013.01); *H03M 1/468* (2013.01)

(58) Field of Classification Search
CPC ......... H03M 1/804; H03M 3/30; H03M 1/12; H03M 1/00; H03M 1/0641
USPC ......... 341/172, 143, 155, 156, 120, 110, 131; 375/297
See application file for complete search history.

(56) References Cited

U.S. PATENT DOCUMENTS

| 7,286,075 B2 | 10/2007 | Hennessy et al. |
| 7,898,453 B2 | 3/2011 | Mathe |

(Continued)

FOREIGN PATENT DOCUMENTS

| JP | 04-059613 U | 5/1992 |
| JP | 2003-037483 A | 2/2003 |

OTHER PUBLICATIONS

International Search Report issued in PCT/JP2012/007794, dated Jan. 8, 2013, with partial English translation.

*Primary Examiner* — Joseph Lauture
(74) *Attorney, Agent, or Firm* — McDermott Will & Emery LLP

(57) ABSTRACT

In a successive approximation AD converter, a noise generator outputs the output of a ΔΣ modulator as a noise signal. A selector circuit can output the noise signal, in place of a digital signal for generating a comparison-target voltage for the next bit, to a capacitor element of a capacitance DAC. During sampling of an analog input voltage, the noise signal is supplied to the capacitance DAC via the selector circuit, and thereafter normal successive approximation operation is executed.

13 Claims, 8 Drawing Sheets

(56) References Cited

U.S. PATENT DOCUMENTS 7,928,880 B2  4/2011  Tsukamoto
2006/0119493 A1*  6/2006  Tal et al. .................. 341/143
2008/0084340 A1  4/2008  Hurrell
2010/0039303 A1  2/2010  Tsukamoto

* cited by examiner

BEFORE APPLICATION OF
Δ Σ MODULATED SIGNAL

AFTER APPLICATION OF
Δ Σ MODULATED SIGNAL

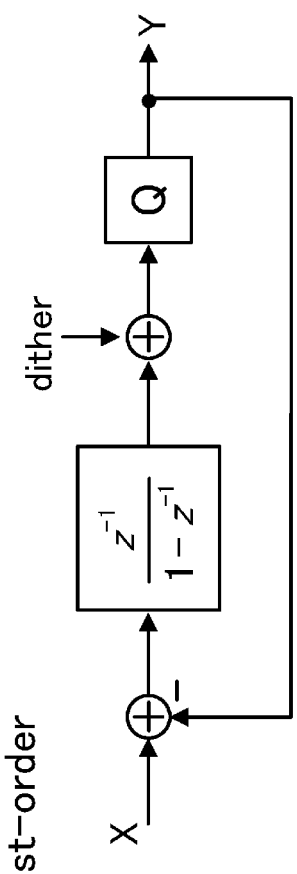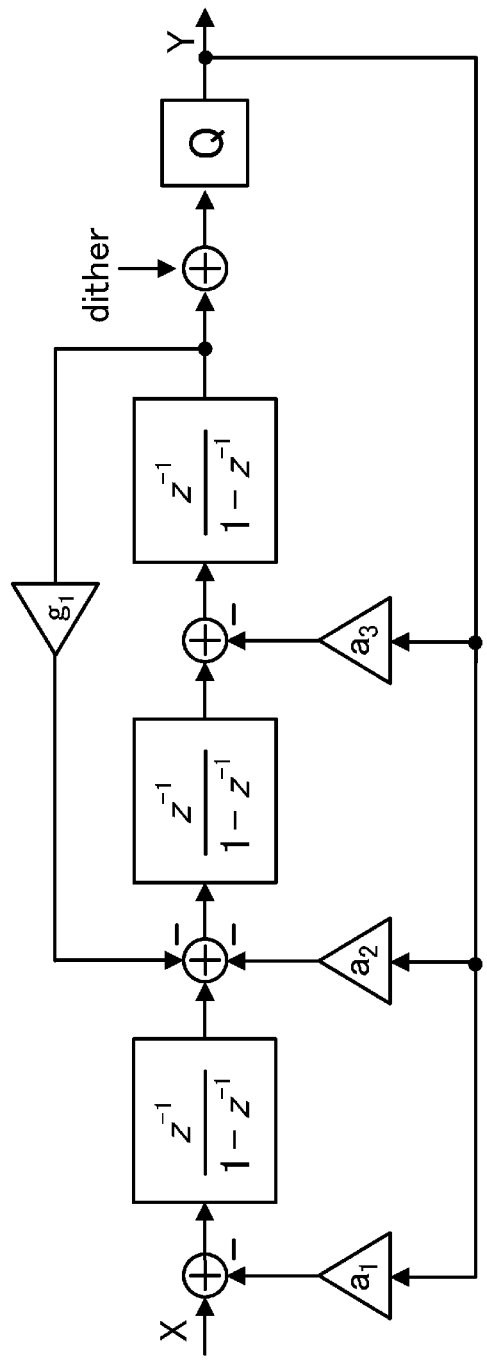
FIG.4A  first-order
FIG.4B  third-order

SUCCESSIVE APPROXIMATION AD CONVERTER AND NOISE GENERATOR

CROSS-REFERENCE TO RELATED APPLICATIONS

This is a continuation of International Application No. PCT/JP2012/007794 filed on Dec. 5, 2012, which claims priority to Japanese Patent Application No. 2011-287433 filed on Dec. 28, 2011. The entire disclosures of these applications are incorporated by reference herein.

BACKGROUND

The present disclosure relates to a successive approximation AD converter, and more particularly to a technology for improving AD conversion precision.

AD converters have various architectures, which are used differently depending on the required specifications. A successive approximation AD converter is configured to obtain a multi-bit digital signal by repeating comparison operation between an analog input voltage and a voltage generated by a digital-to-analog converter (hereinafter referred to as a DAC) successively from the highest-order bit. Therefore, the converter can be formed only of a comparator, a DAC, and a simple digital circuit, serving as an architecture most likely to achieve reduction in size and power consumption.

The conversion precision of the successive approximation AD converter largely depends on the precision of the DAC. As the DAC, a capacitance array having capacitance values weighted with a binary ratio is generally used. In particular, for a high-resolution capacitance DAC, a technique of dividing the capacitance array into a higher-order DAC and a lower-order DAC and coupling such DACs to each other by a coupling capacitor is used to suppress increase in the capacitance values of the capacitance array.

Reducing the size of capacitor elements increases mismatches and variations of the capacitance values, causing an error in weighting between higher-order part and lower-order part. An error also occurs in the weighting with a binary ratio for higher-order bits for which a precise capacitance ratio is particularly required. As a result, the output characteristics of the capacitance DAC become nonlinear, worsening the conversion precision of the successive approximation AD converter. Such nonlinear characteristics of the converted output result in generating a noise tone on the output spectrum, causing degradation in spurious free dynamic range (SFDR). For this reason, it has been considered difficult to use the successive approximation AD converter in the fields requiring high SFDR such as the communication and audio fields.

As a technique of preventing or reducing the tone on the output spectrum, a dithering technique has been proposed where noise having no periodicity is applied to the input signal (see U.S. Pat. No. 7,286,075 (Patent Document 1), for example).

Also proposed has been a technique of preventing or reducing a nonlinear error caused by a weighting error between higher-order part and lower-order part of a capacitance DAC by adjusting a variable capacitor placed in the lower-order part (see U.S. Pat. No. 7,928,880 (Patent Document 2), for example).

SUMMARY

In the dithering technique as in Patent Document 1 described above, with white noise being applied with a pseudorandom signal, in-band floor noise also rises, causing degradation in signal to noise plus distortion ratio (SNDR).

In the technique of adjusting the weighting between the higher-order part and the lower-order part of the capacitance DAC as in Patent Document 2 described above, since the variable capacitor in the lower-order part can be adjusted only stepwise, the error cannot be completely removed because of insufficient correction resolution. Therefore, due to a weighting error between the higher-order part and the lower-order part, the AD conversion results have nonlinear characteristics, leaving a tone on the output spectrum.

In view of the above, it is an objective of the present disclosure to improve the AD conversion precision without raising in-band noise in a successive approximation AD converter.

According to the first mode of the present disclosure, a successive approximation AD converter configured to convert an analog input voltage to a digital value includes: a capacitance DAC having a plurality of capacitor elements having weighted capacitance values, configured so that first terminals of the capacitor elements are connected to a common node and either a first or second reference voltage is selectively applied to second terminals thereof according to a first digital signal; a comparator at least having an input connected to the common node of the capacitance DAC, configured to compare the analog input voltage with a comparison-target voltage generated by the capacitance DAC; a successive approximation control section configured to set a second digital signal for generating the comparison-target voltage for the next bit from the comparison result of the comparator and output the resultant signal; a noise generator having at least one $\Delta\Sigma$ modulator, configured to output an output of the $\Delta\Sigma$ modulator as a noise signal; and a selector circuit provided for at least one of the plurality of capacitor elements, configured to select either the second digital signal or the noise signal for the capacitor element and output the selected signal as the first digital signal.

In the mode described above, the noise generator outputs the output of the $\Delta\Sigma$ modulator as the noise signal. The selector circuit can select the noise signal output from the noise generator in place of the corresponding second digital signal for generating a comparison-target voltage for the next bit, and output the selected signal to the corresponding capacitor element of the capacitance DAC as the first digital signal. With this configuration, by supplying the noise signal to the capacitance DAC during sampling of the analog input voltage and thereafter executing normal successive approximation operation, it is possible to execute AD conversion for an analog input voltage to which the noise amount according to the $\Delta\Sigma$ modulated signal has been applied. Thus, since an in-band tone can be dispersed by use of the $\Delta\Sigma$ modulated signal and this significantly improves SFDR, high-precision AD conversion results can be obtained.

According to the second mode of the present disclosure, a successive approximation AD converter configured to convert an analog input voltage to a digital value includes: a capacitance DAC having a plurality of capacitor elements having weighted capacitance values, configured so that first terminals of the capacitor elements are connected to a common node and either a first or second reference voltage is selectively applied to second terminals thereof according to a first digital signal; a comparator at least having an input connected to the common node of the capacitance DAC, configured to compare the analog input voltage with a comparison-target voltage generated by the capacitance DAC; a successive approximation control section configured to set a second digital signal for generating the comparison-target voltage for the next bit from the comparison result of the comparator and output the resultant signal; a capacitance DAC control circuit configured to select either a correction control signal or the second digital signal and output the selected signal to the capacitance DAC as the first digital signal; and a ΔΣ modulator configured to receive a capacitance value control signal, wherein the capacitance DAC has at least one variable capacitor element where a first terminal thereof is connected to the common node, either the first or second reference voltage is selectively applied to a second terminal thereof according to a bit as part of the second digital signal, and the capacitance value is controlled according to an output signal of the ΔΣ modulator.

In the mode described above, while the correction control signals are being supplied to some capacitor elements of the capacitance DAC from the capacitance DAC control circuit, the other capacitor elements of the capacitance DAC can be operated. Based on AD converted values obtained by this operation, the capacitance value of the variable capacitor element can be determined. In this relation, by adjusting the capacitance value of the variable capacitor element using the ΔΣ modulator, the capacitance value can be adjusted more finely than the adjustment resolution of the variable capacitor element itself. Thus, since the capacitance mismatch of the capacitance DAC can be corrected more precisely, high-precision AD conversion results can be obtained.

According to the third mode of the present disclosure, a successive approximation AD converter configured to convert an analog input voltage to a digital value includes: a capacitance DAC having a plurality of capacitor elements having weighted capacitance values, configured so that first terminals of the capacitor elements are connected to a common node and either a first or second reference voltage is selectively applied to second terminals thereof according to a first digital signal, the capacitance DAC being divided into a higher-order DAC including capacitor elements corresponding to higher-order bits of the digital value and a lower-order DAC including capacitor elements corresponding to lower-order bits of the digital value, a coupling capacitor being inserted between the higher-order DAC and the lower-order DAC at the common node; a comparator at least having an input connected to the common node of the capacitance DAC, configured to compare the analog input voltage with a comparison-target voltage generated by the capacitance DAC; a successive approximation control section configured to set a second digital signal for generating the comparison-target voltage for the next bit from the comparison result of the comparator and output the resultant signal; a higher-order DAC control circuit configured to select either a correction control signal or the second digital signal and output the selected signal to the higher-order DAC as the first digital signal; and a ΔΣ modulator configured to receive a capacitance value control signal, wherein the lower-order DAC has a variable capacitor element where a first terminal thereof is connected to the common node, a second terminal thereof is grounded, and the capacitance value is controlled according to an output signal of the ΔΣ modulator.

In the mode described above, even when a parasitic capacitance is present in the lower-order DAC, the weighting error between the higher-order DAC and the lower-order DAC can be corrected by appropriately adjusting the capacitance value of the variable capacitor element. Moreover, by adjusting the capacitance value of the variable capacitor element using the ΔΣ modulator, a capacitance value finer than the adjustment resolution of the variable capacitor element can be achieved. In this way, since the weighting error between the higher-order DAC and the lower-order DAC can be corrected more precisely, high-precision AD conversion results can be obtained.

According to the fourth mode of the present disclosure, a noise generator has a plurality of ΔΣ modulators and is configured to supply output signals of the ΔΣ modulators as noise signals, wherein the noise signals are signals obtained by individually adding differently-weighted values to the output signals of the ΔΣ modulators.

According to the present disclosure, since an in-band tone can be dispersed by use of the ΔΣ modulated signals, SFDR can be significantly improved, and thus improvement in AD conversion precision can be achieved.

Also, according to the present disclosure, since a nonlinear error caused by capacitance mismatch of the capacitance DAC can be corrected with high precision by use of the ΔΣ modulated signals, improvement in AD conversion precision can be achieved.

BRIEF DESCRIPTION OF THE DRAWINGS

FIG. 3A shows an output spectrum observed when no noise signal is applied and FIG. 3B shows an output spectrum observed when a noise signal is applied.

FIG. 4A shows an example configuration of a first-order ΔΣ modulator, and FIG. 4B shows an example configuration of a third-order ΔΣ modulator.

DETAILED DESCRIPTION

Embodiments of the present disclosure will be described hereinafter with reference to the relevant drawings.

First Embodiment

Figure 1:
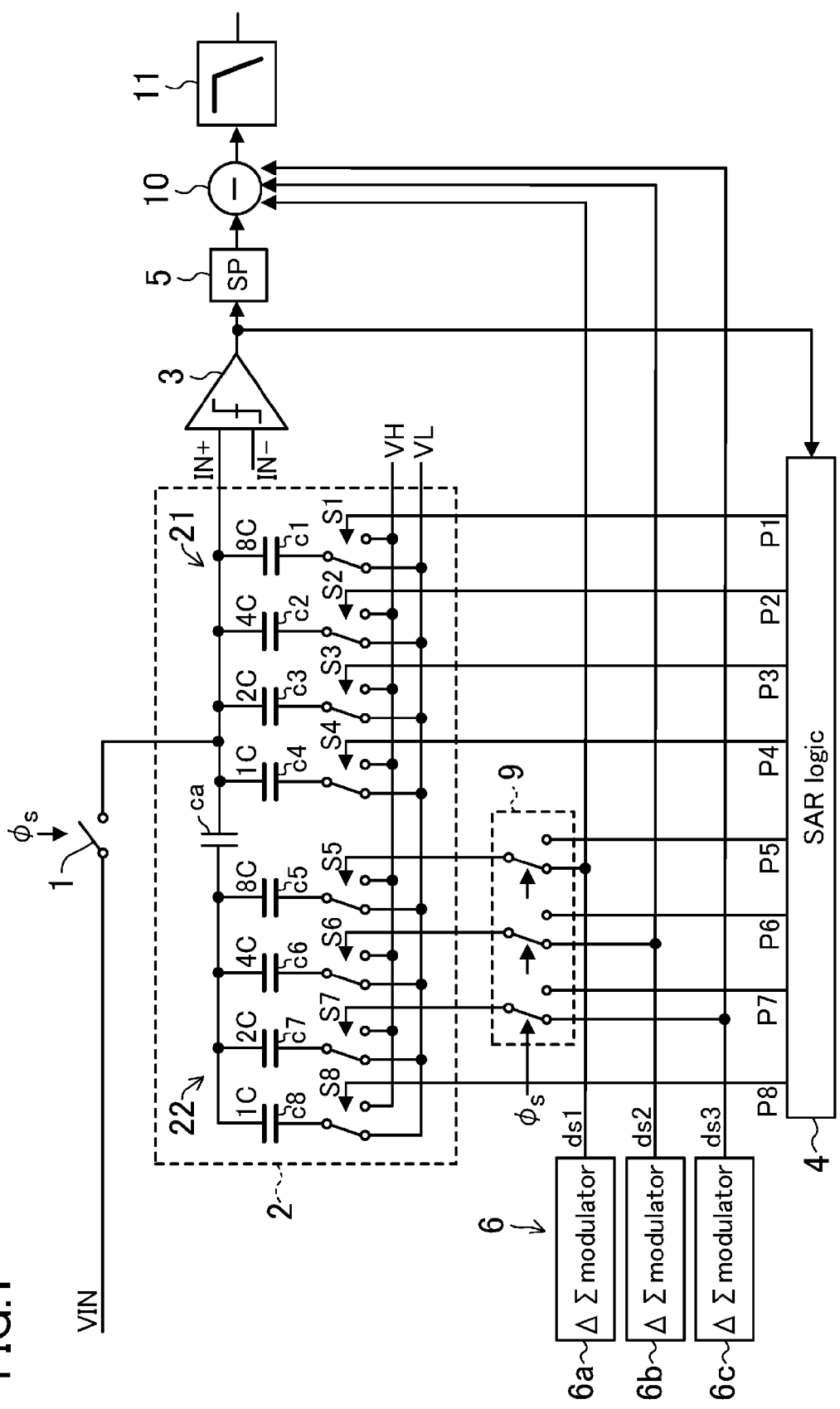
FIG. 1 is a block diagram of a successive approximation AD converter according to the first embodiment.

FIG. 1 shows a configuration of a successive approximation AD converter according to the first embodiment. The successive approximation AD converter in FIG. 1 includes: a switch 1 that samples an analog input voltage VIN; a capacitance DAC 2 having a plurality of capacitor elements c1 to c8 having capacitance values weighted with a binary ratio; a comparator 3 that compares two input voltages with each other; a successive approximation control section 4 that sets digital signals P1 to P8 for generation of a comparison target voltage for the next bit from the comparison results of the comparator 3 and outputs the digital signals; and a serial-to-parallel conversion section 5 that converts the comparison results of the comparator 3 to a multi-bit signal. FIG. 1 shows an 8-bit support type as an example. The capacitance values of the capacitor elements c1 to c8 are indicated in FIG. 1 near the respective elements (with C as the reference value).

FIG. 1 is depicted so that the output of the capacitance DAC 2 is connected to a non-inverting input terminal IN+ of the comparator 3 and none is connected to an inverting input terminal IN−. Actually, however, in the case that the analog input voltage is a single end signal, a voltage at the center in the input range of the successive approximation AD converter (hereinafter such a voltage is referred to as an input center voltage) will be connected to the inverting input terminal IN− of the comparator 3. For example, when the input range is from 0 to Vdd, the input center voltage is Vdd/2. In the case that the analog input voltage is a differential signal, another switch and another capacitance DAC will be provided for the negative-side signal of the differential signal, and the output of this capacitance DAC will be connected to the inverting input terminal IN− of the comparator 3.

The capacitance DAC 2 is configured so that first terminals of the capacitor elements c1 to c8 are connected to a common node and second terminals thereof are independently connected to either a reference voltage VH or VL selectively according to digital signals S1 to S8, respectively. In the illustrated example, the capacitance DAC 2 is divided into a higher-order DAC 21 including the capacitor elements c1 to c4 corresponding to higher-order bits of an output digital value and a lower-order DAC 22 including the capacitor elements c5 to c8 corresponding to lower-order bits of the output digital value. A coupling capacitor ca is inserted between the higher-order DAC 21 and the lower-order DAC 22 at the common node.

The successive approximation AD converter in FIG. 1 further includes: a noise generator 6 having three $\Delta\Sigma$ modulators 6a, 6b, and 6c; a selector circuit 9 provided for the capacitor elements c5 to c7; a subtraction circuit 10 that subtracts a value corresponding to noise signals ds1 to ds3 output from the noise generator 6 from the output code of the serial-to-parallel conversion circuit 5; and a digital filter circuit 11 that removes an out-of-band signal from the output of the subtraction circuit 10. The three $\Delta\Sigma$ modulators 6a, 6b, and 6c are configured to output digital signals uncorrelated to one another. The selector circuit 9 selects either the noise signals ds1 to ds3 output from the noise generator 6 or the digital signals P5 to P7 output from the successive approximation control section 4, and outputs the selected ones as the digital signals S5 to S7. The selection operation by the selector circuit 9 is performed with a sampling timing signal φs that controls the switch 1.

Figure 2:
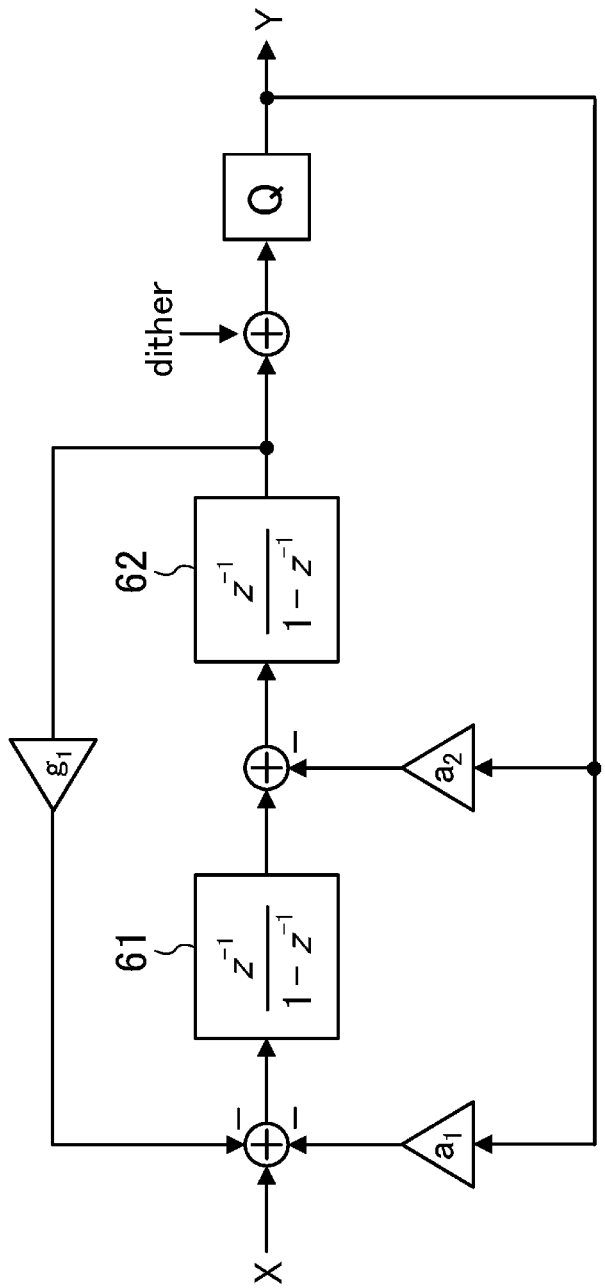
FIG. 2 is a block diagram of a ΔΣ modulator included in a noise generator.

FIG. 2 shows an example configuration of the $\Delta\Sigma$ modulators 6a, 6b, and 6c of the noise generator 6. A general configuration of a second-order $\Delta\Sigma$ modulator is shown in FIG. 2, where 61 and 62 denote integrators. Assume herein that, to constitute the $\Delta\Sigma$ modulators 6a, 6b, and 6c that are uncorrelated to one another, a local feedback coefficient $g_1$ is changed among the $\Delta\Sigma$ modulators 6a, 6b, and 6c.

First, the conversion operation of a normal successive approximation AD converter having neither the noise generator 6 nor the selector circuit 9 will be described. Assume herein that, in the capacitance DAC 2, the voltage VH is supplied to the second terminals of the capacitor elements c1 to c8 when the respective digital signals S1 to S8 are "1" and the voltage VL is supplied when they are "0."

The switch 1 is turned on to sample the analog input voltage VIN. At this time, (1, 0, 0, 0, 0, 0, 0, 0) have been given as the initial values of the digital signals S1 to S8 (=P1 to P8) for the capacitance DAC 2. The analog input voltage VIN is therefore compared with a voltage (VH−VL)/2, and which one of the voltages is large is determined by the comparator 3.

The value of the MSB of the output digital value is decided from this comparison result. Based on this MSB value, the successive approximation control section 4 sets the digital signals P1 to P8 for generation of the comparison target voltage for the next bit and outputs the signals.

More specifically, when the MSB value is "1," the digital signal P2 corresponding to the next bit (capacitor c2) is changed from "0" to "1" while the digital signal P1 corresponding to the highest-order bit (capacitor c1) is kept "1." By this change, the analog input voltage VIN is compared with a voltage 3(VH−VL)/4 for determination of the next bit. On the other hand, when the MSB value is "0," the digital signal P1 corresponding to the highest-order bit is changed from "1" to "0" and the digital signal P2 corresponding to the next bit is changed from "0" to "1." By this change, the analog input voltage VIN is compared with a voltage (VH−VL)/4 for determination of the next bit.

The procedure of changing ones of the digital signals P1 to P8 corresponding to the bit subjected to the comparison determination and the next bit from "1" to "0" or from "0" to "1" as described above is repeated successively in descending order from MSB. The comparison determination results of the bits are output from the serial-to-parallel conversion circuit 5 as an 8-bit AD converted value.

Figure 9A:
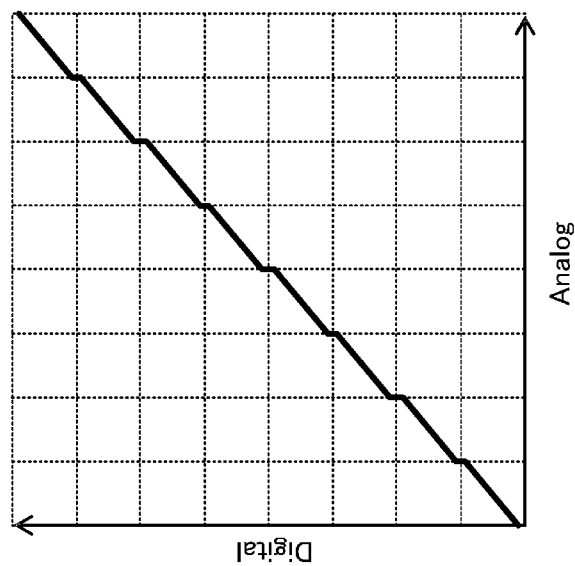
FIGS. 9A and 9B are graphs showing AD conversion characteristics that are nonlinear.
Figure 9B:
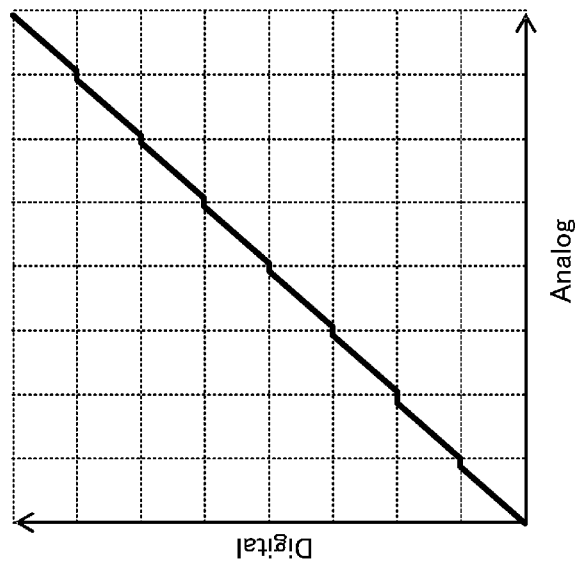

In order to obtain an AD converted value with high linearity and high precision, the capacitor elements c1 to c8 of the capacitance DAC 2 are required to have capacitance values weighted with a precise binary ratio. However, due to presence of a parasitic capacitance and variations in capacitance value, the weighting may become different between the higher-order DAC 21 and the lower-order DAC 22, failing to obtain a precise binary ratio, and this may cause occurrence of an error in the output of the capacitance DAC 2. As a result, the AD conversion output may have nonlinear characteristics as shown in FIGS. 9A and 9B, causing degradation in SNDR and SFDR.

To address the above-described problem, according to this embodiment, the noise generator 6 and the selector circuit 9 are provided to apply a $\Delta\Sigma$ modulated signal to the input analog voltage VIN.

The operation of the successive approximation AD converter according to this embodiment will be described hereinafter.

First, during sampling, the switch 1 is turned on with the sampling timing signal φs to sample the analog input voltage VIN. At this time, the successive approximation control section 4 outputs (1, 0, 0, 0, 0, 0, 0, 0) as the initial values of the digital signals P1 to P8. Also, the selector circuit 9 selects and outputs the noise signals ds1 to ds3 output from the noise generator 6 in response to the sampling timing signal φs. As a result, the digital signals S1 to S8 supplied to the capacitance DAC 2 are (1, 0, 0, 0, ds1, ds2, ds3, 0). When the noise signals (ds1, ds2, ds3) are (1, 0, 1), for example, (1, 0, 0, 0, 1, 0, 1, 0) are input into the capacitance DAC 2.

After the sampling, the switch 1 is opened with the sampling timing signal φs. At this time, the selector circuit 9 selects and outputs the digital signals P5 to P7 output from the successive approximation control section 4. Thus, the digital signals S1 to S8 supplied to the capacitance DAC 2 return to the initial values (1, 0, 0, 0, 0, 0, 0, 0). As a result, charge transfer occurs in the capacitors c5 and c7 where the digital signals S1 to S8 have changed, causing a noise amount corresponding to the weighting of the capacitors c5 and c7 (10C=2C+8C) to be applied to the analog input voltage VIN. Thereafter, the normal successive approximation operation described above is executed from MSB down to LSB. By this operation, obtained is an 8-bit output digital value for the analog input voltage VIN to which the noise amount generated by the noise signals ds1 to ds3 has been applied.

The subtraction circuit 10 subtracts a digital value corresponding to the applied noise amount from the output digital value obtained by the operation described above. The value to be subtracted is a binary value that constitutes the values of the bits of the output digital value corresponding to the noise signals ds1, ds2, ds3. In this example, it is 10 (="1010"). Finally, the digital filter circuit 11 removes an out-of-band signal from the output of the subtraction circuit 10.

As described above, at the time of AD conversion of the analog input voltage VIN, the operation of applying a noise amount to the voltage during the sampling is performed repeatedly. The noise generator 6 has three ΔΣ modulators 6a, 6b, and 6c uncorrelated to one another, and generates eight kinds of random values as the noise signals ds1 to ds3. The noise amount generated by the digital output signals ds1 to ds3 is applied to the input analog signal VIN. Therefore, even an AD converter having nonlinear characteristics will no more continue taking the same value periodically, and thus generation of a tone can be prevented or reduced.

Figure 3A:
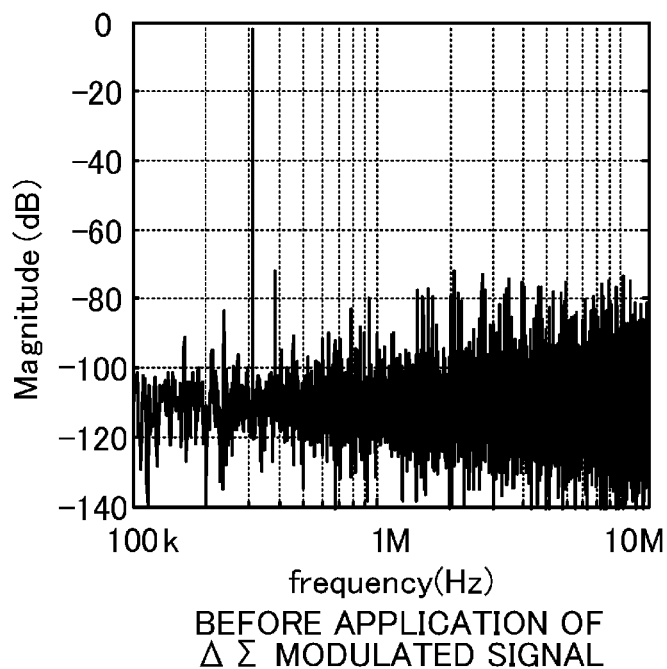
FIGS. 3A and 3B show an effect of the first embodiment, where
Figure 3B:
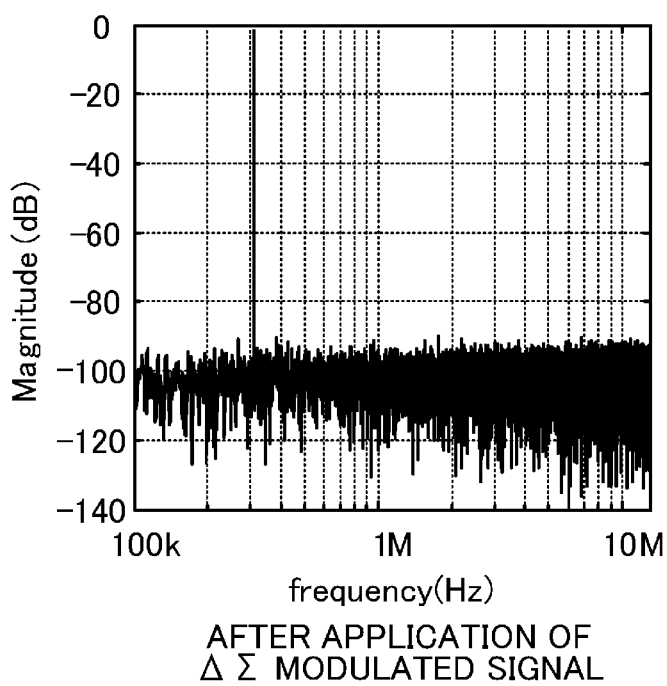

FIGS. 3A and 3B are views showing the effect of this embodiment, where FIG. 3A shows a spectrum observed when no noise signal is applied and FIG. 3B shows a spectrum observed when a noise signal is applied. In FIG. 3A, both SFDR and SNDR are degraded due to a tone caused by a capacitance mismatch error. In contrast, in FIG. 3B, an in-band tone is dispersed, exhibiting significant improvement in SFDR.

Note that, since the noise signal applied has been ΔΣ-modulated, the rise in noise floor within the band is small. Therefore, when the successive approximation AD converter according to this embodiment is used as an oversampling AD converter that removes high-frequency components with a digital filter, it is not necessarily required to subtract the digital value corresponding to the applied noise amount from the output digital value. That is, it is not necessarily required to provide the subtraction circuit 10.

Although the capacitance DAC 2 is divided into the higher-order DAC and the lower-order DAC in FIG. 1, the configuration is not limited to this, but the advantage of this embodiment can also be obtained by a configuration having no division into a higher-order DAC and a lower-order DAC.

Supplemental remarks will be made hereinafter on the noise generator 6. The plurality of ΔΣ modulators mutually uncorrelated to one another are weighted with different values in a binary ratio, and by summing the weighted results, multi-value noise equal in occurrence probability can be output. Therefore, the noise generator 6 can be used for effectively dispersing a tone in, not only the successive approximation AD converter, but also other general AD converters. For example, SFDR can also be improved by imparting binary weights to the digital signals ds1, ds2, and ds3 generated by the noise generator 6, DA-converting the sum of the weighted results, and superimposing the resultant analog value on the input signal of a general AD converter.

While the noise generator 6 has three ΔΣ modulators 6a, 6b, and 6c, and supplies the three generated noise signals ds1 to ds3 to the capacitor elements c5 to c7 in this embodiment, the configuration is not limited to this. For example, the noise signals may be supplied to other capacitor elements. The number of ΔΣ modulators may be one or a plural number other than three. Also, the number of capacitor elements to which noise signals are supplied may be one or a plural number other than three.

Also, since one ΔΣ modulator can output a multi-bit digital signal, the number of ΔΣ modulators is not required to be the same as the number of capacitor elements to which the noise signal is supplied, and no one-to-one correspondence is required, either.

When a plurality of ΔΣ modulators are provided, the ΔΣ modulators must be tuned to output mutually uncorrelated modulated signals so as not to generate intermodulation noise. For example, as described above, uncorrelated signals can be output by setting the local feedback coefficients of the ΔΣ modulators to different values from one another.

There are other techniques of providing a plurality of uncorrelated ΔΣ modulators, such as ones of changing the order and changing the random pattern for dithering. For example, instead of the second-order configuration shown in FIG. 2, three ΔΣ modulators may be implemented using first-order and third-order configurations as shown in FIGS. 4A and 4B.

Second Embodiment

Figure 5:
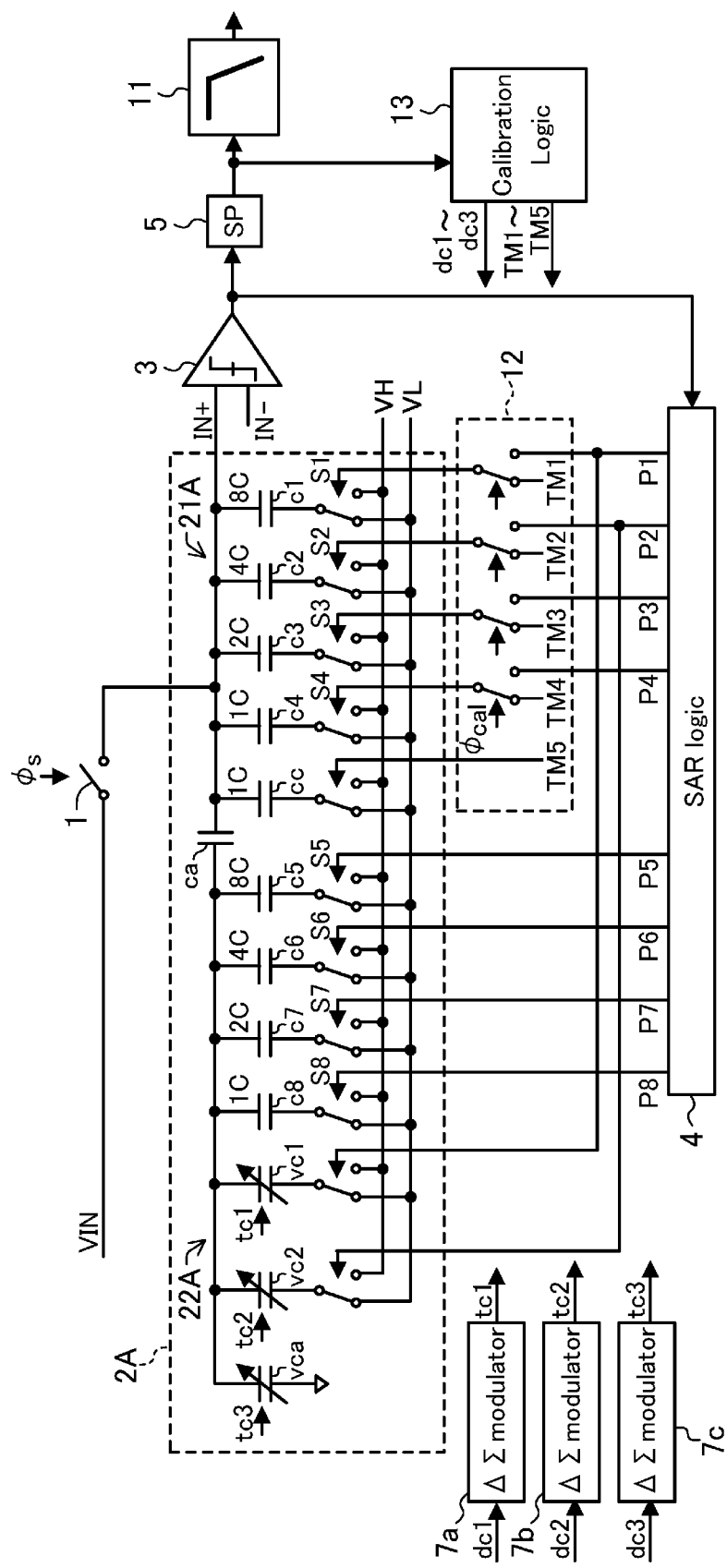
FIG. 5 is a block diagram of a successive approximation AD converter according to the second embodiment.

FIG. 5 is a block diagram of a successive approximation AD converter according to the second embodiment. In FIG. 5, components in common with those in FIG. 1 are denoted by the same reference characters, and detailed description thereof is omitted here.

In FIG. 5, in a capacitance DAC 2A, a higher-order DAC 21A includes, in addition to the capacitor elements c1 to c4, a capacitor element cc having a first terminal connected to the common node. The capacitor element cc is a dummy capacitor element used for correction of capacitance mismatch in the higher-order DAC 21A. Also, a lower-order DAC 22A includes, in addition to the capacitor elements c5 to c8, variable capacitor elements vc1, vc2, vca each having a first terminal connected to the common node and having a variable capacitance value. The variable capacitor elements vc1 and vc2 are used for correcting a mismatch error in the capacitor elements c1 and c2, respectively, of the higher-order DAC 21A, and the variable capacitor element vca is used for correcting a weighting error between the higher-order DAC 21A and the lower-order DAC 22A.

The successive approximation AD converter in FIG. 5 further includes: a correction control circuit 13 that receives lower-order bits of the output signal of the serial-to-parallel conversion circuit 5, and outputs correction control signals TM1 to TM5 for the higher-order DAC 21A and capacitance value control signals dc1 to dc3 for controlling the capacitance values of the variable capacitor elements vc1, vc2, and vca: a higher-order DAC control circuit 12 that selectively outputs either the correction control signals TM1 to TM4 or the digital signals P1 to P4 to the higher-order DAC 21A as the digital signals S1 to S4, respectively; and ΔΣ modulators 7a to 7c that output ΔΣ modulated signals tc1 to tc3 that control the capacitance values of the variable capacitor elements vc1, vc2, and vca, respectively. Assume herein that a correction timing signal φcal for controlling the higher-order DAC control circuit 12 is output from the correction control circuit 13.

During correction, the higher-order DAC control circuit 12 selectively outputs the correction control signals TM1 to TM4 as the digital signals S1 to S4 in response to the correction timing signal φcal. In other words, at this time, (TM1, TM2, TM3, TM4, P5, P6, P7, P8) are input into the capacitance DAC 2A as the digital signals S1 to S8. As for the capacitor element cc, either the reference voltage VH or VL is selectively applied to the second terminal thereof according to the correction control signal TM5. Either the reference voltage VH or VL is also selectively applied to the second terminals of the variable capacitor elements vc1 and vc2 according to the digital signals P1 and P2 output from the successive approximation control circuit 4 that respectively correspond to the capacitor elements c1 and c2 of the higher-order DAC 21A. The second terminal of the variable capacitor element vca is grounded.

Figure 6:
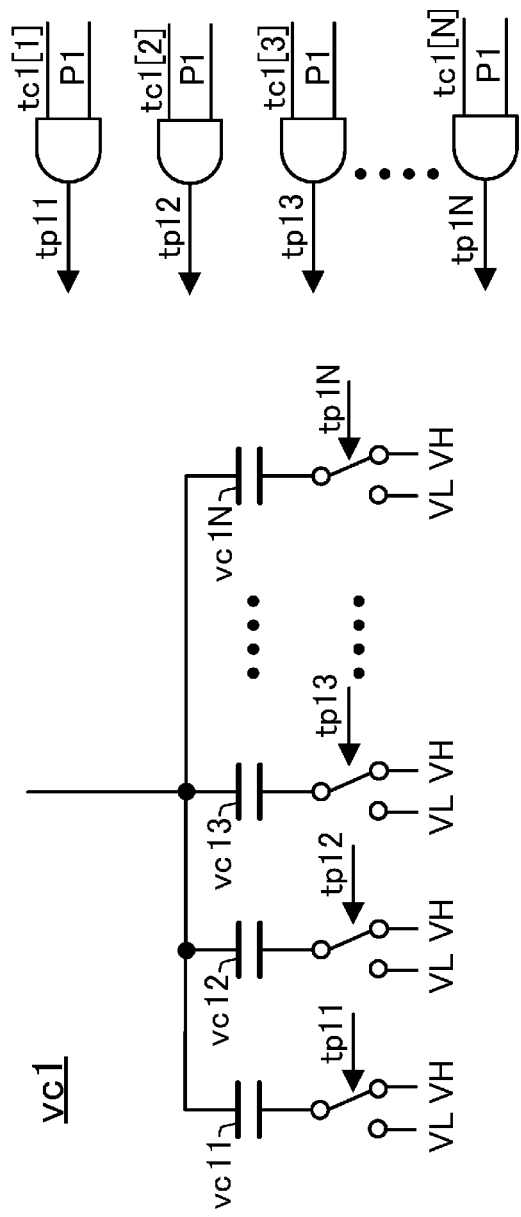
FIG. 6 is a view showing an example configuration of a variable capacitor element for capacitance mismatch correction.

FIG. 6 shows an example configuration of the variable capacitor elements vc1. The variable capacitor element vc1 includes a capacitance array constituted by capacitor elements vc11, vc12, . . . , vc1N. The capacitance values of these capacitor elements may be the same or different from one another. The capacitor elements vc11, vc12, . . . , vc1N are configured so that first terminals thereof are connected to the common node in the lower-order DAC 22A and second terminals thereof are independently connected to either the reference voltage VH or VL selectively according to input control signals tp11, tp12, . . . , tp1N, respectively. The control signals tp11, tp12, . . . , tp1N are obtained as a result of logical operation (e.g., AND) of the respective bits of the control signal tc1 and the signal P1. Therefore, by controlling the value of the control signal tc1, the capacitance value of the variable capacitor element vc1 can be controlled variably. Moreover, either the reference voltage VH or VL can be selectively applied to the second terminal of the variable capacitor element vc1 in association with the second terminal of the capacitor element c1 of the higher-order DAC 21A. This also applies to the variable capacitor element vc2.

Figure 7:
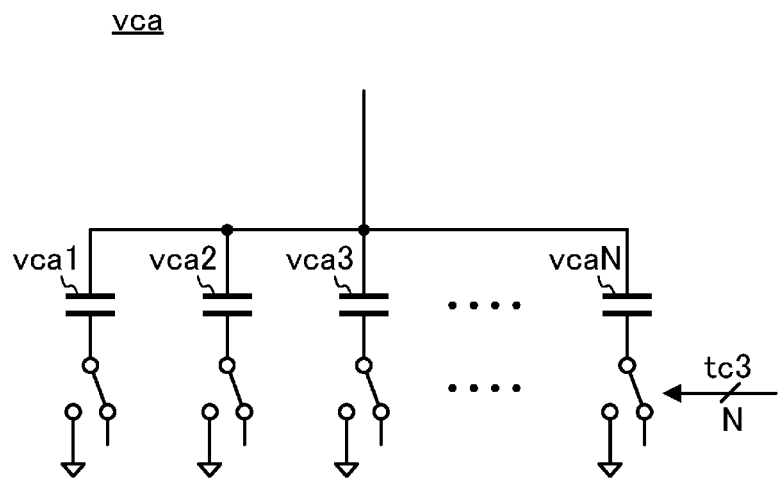
FIG. 7 is a view showing an example configuration of a variable capacitor element for parasitic capacitance value adjustment.

FIG. 7 shows an example configuration of the variable capacitor element vca. The variable capacitor element vca includes a capacitance array constituted by capacitor elements vca1, vca2, . . . , vcaN. The capacitance values of these capacitor elements may be the same or different from one another. The capacitor elements vca1, vca2, . . . , vcaN are configured so that first terminals thereof are connected to the common node in the lower-order DAC 22A, and second terminals thereof are independently connected to either a fixed potential (e.g., a ground potential) or a floating node selectively according to the control signal tc3 input thereinto. Therefore, by controlling the value of the control signal tc3, the parasitic capacitance value of the lower-order DAC 22A can be controlled variably.

In this embodiment, a mismatch error in the capacitor elements and a weighting error can be corrected precisely by use of the $\Delta\Sigma$ modulators. The correction operation of the successive approximation AD converter according to this embodiment will be described hereinafter.

<Capacitance Mismatch Error in Higher-Order DAC>

In the illustrate example, a mismatch error in the capacitor elements c1 and c2 of the higher-order DAC 21A is to be corrected using the $\Delta\Sigma$ modulators 7a and 7b. When there are a plurality of capacitor elements to be corrected, the correction is started from the capacitor element corresponding to the lowest-order bit. In the illustrated example, therefore, the correction is started from the capacitor element c2.

First, the correction control circuit 13 controls the higher-order DAC control circuit 12 as the capacitance DAC control circuit to allow the correction control signals TM1 to TM4 to be input into the higher-order DAC 21A, and sets the correction control signals TM1 to TM5 to (0, 1, 0, 0, 0). Also, the switch 1 is closed to sample the analog input voltage VIN that is a fixed potential (e.g., the input center voltage).

Figure 8:
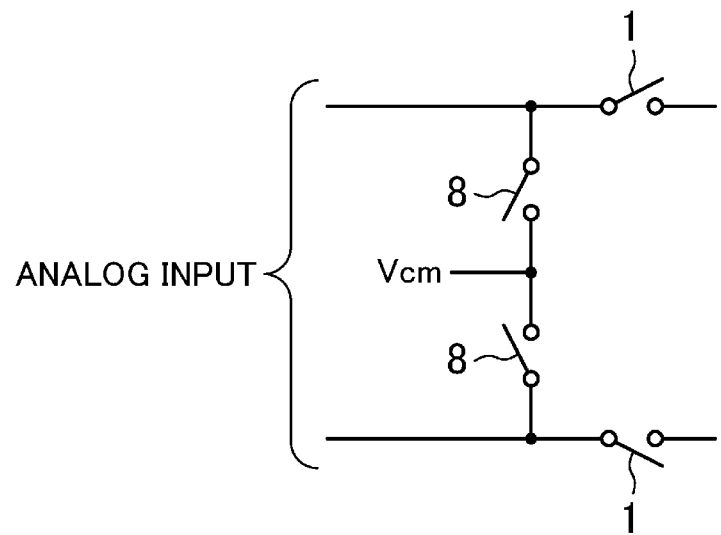
FIG. 8 shows an example of a means for sampling an input center voltage.

The sampling of the input center voltage can be performed in various ways. For example, switches that short-circuit the differential input pair of the comparator 3 may be provided. By short-circuiting such switches, the input center voltage can be sampled. However, connection of such switches to the input terminals of the comparator 3 will increase the parasitic capacitance, etc. It is therefore preferable to provide a means for inputting the input center voltage at positions upstream of the switches 1. For example, as shown in FIG. 8, when the analog input voltage is a differential signal, switches 8 may be provided between a common mode voltage Vcm and the signal input terminals of the switches 1, and in sampling of the input center voltage, the switches 1 and 8 may be closed.

Thereafter, the switch 1 is opened, and the correction control circuit 13 sets the correction control signals TM1 to TM5 to (0, 0, 1, 1, 1). This indicates that the digital input signal for the capacitor element c2 to be corrected changes from "1" to "0" and the digital input signals for the capacitor elements c3 and c4 corresponding to bits lower in order than the capacitor element c2 and for the dummy capacitor element cc change from "0" to "1." In an ideal state of the capacitance ratio precision, the capacitance value of the capacitor element c2 is 4C, and the total capacitance value of the capacitor elements c3, c4, and cc is also 4C (=2C+1C+1C), which are equal to each other. Therefore, with the charge transfer amount being equal, the potential at the common node of the higher-order DAC 21 is assumed to be kept unchanged.

However, since the weighting of the capacitance values in the higher-order DAC 21A is not ideal due to capacitance mismatch, the capacitance value of the capacitor element c2 and the total capacitance value of the capacitor elements c3, c4, and cc are not necessarily equal to each other. Therefore, when the above-described control is performed, a potential change will occur at the common node in the higher-order DAC 21A. By AD-converting this voltage using only the lower-order DAC 22A, the capacitance value error between the capacitor element c2 and the capacitor elements c3, c4, and cc can be obtained as a digital value Dvm2.

Since the obtained digital value Dvm2 includes an offset of the comparator 3, Dvm2 does not precisely represent the mismatch error in the capacitor element c2 to be corrected. It is therefore necessary to obtain the offset value of the comparator 3 also as a digital value.

The offset of the comparator 3 can be obtained in the following manner. First, the switch 1 is closed to sample the input center voltage VIN. At this time, the correction control signals TM1 to TM5 supplied to the higher-order DAC 21A are kept to fixed values such as (1, 0, 0, 0, 0). Subsequently, the switch 1 is opened, and by repeating the successive approximation control by only the lower-order DAC 22A, an offset value Doff of the comparator 3 can be obtained.

From the difference between the obtained digital value Dvm2 and the offset value Doff of the comparator 3, a mismatch error Ddif2 in the capacitor element c2 can be obtained. That is, $$Ddif2 = Dvm2 - Doff$$

is established.

In the process of obtaining the digital value Dvm2 and the offset value Doff, it is necessary to sample the same voltage value over a fixed period of time, to repeat the AD conversion, and average the resultant values. By averaging the values, which is made due to an influence of noise, the mismatch error in the capacitor element c2 can be measured with a precision as high as 1 LSB or less. In other words, a corrected value further finer than the adjustment resolution of the variable capacitor element shown in FIG. 6 can be obtained.

In this embodiment, the $\Delta\Sigma$ modulator 7b is used to achieve a corrected value further finer than the adjustment resolution of the variable capacitor element. That is, the correction control circuit 13 outputs the digital value dc2 corresponding to the corrected value of the mismatch error Ddif2 in the capacitor element c2 obtained by the technique described above to the $\Delta\Sigma$ modulator 7b. The $\Delta\Sigma$ modulator 7b achieves a capacitance value for the variable capacitor element vc2 finer than the adjustment resolution of the element vc2 using the occurrence probability of 0, 1 pattern of the ΔΣ modulated signal tc2. In this way, the mismatch error in the capacitor element c2 can be corrected more precisely using the variable capacitor element vc2 of the lower-order DAC 22A.

Subsequently, correction of mismatch in the capacitor element c1 will be described. The correction of the capacitor element c1 is performed after the capacitance value of the variable capacitor element vc2 has been adjusted.

First, the correction control circuit 13 controls the higher-order DAC control circuit 12 to allow the correction control signals TM1 to TM4 to be input into the higher-order DAC 21A, and sets the correction control signals TM1 to TM5 to (1, 0, 0, 0, 0). Also, the switch 1 is closed to sample the analog input voltage VIN that is a fixed potential (e.g., the input center voltage).

Thereafter, the switch 1 is opened, and the correction control circuit 13 sets the correction control signals TM1 to TM5 to (0, 1, 1, 1, 1). At this time, a potential change occurs at the common node in the higher-order DAC 21A due to a difference between the charge transfer amount of the capacitor element c1 to be corrected and the total charge transfer amount of the capacitor elements c2, c3, c4, and cc. This potential change is AD converted using only the lower-order DAC 22A, to obtain a digital value Dvm1 that indicates the capacitance value error between the capacitor element c1 and the capacitor elements c2, c3, c4, and cc. As in the case of the capacitor element c2, a mismatch error Ddif1 in the capacitor element c1 can be calculated by $$Ddif1 = Dvm1 - Doff.$$

The correction control circuit 13 outputs the digital value dc1 corresponding to the corrected value of the mismatch error Ddif1 in the capacitor element c1 obtained by the technique described above to the ΔΣ modulator 7a. The ΔΣ modulator 7a achieves correction of the capacitance value of the variable capacitor element vc1 finer than the adjustment resolution of the element vc1 using the occurrence probability of 0, 1 pattern of the ΔΣ modulated signal tc1. In this way, the mismatch error in the capacitor element c1 can be corrected more precisely using the variable capacitor element vc1 of the lower-order DAC 22A.

In the case of using the ΔΣ modulators 7a and 7b, no periodical noise is applied unlike the case of achieving decimal point representation using a counter, etc. Therefore, SNDR can be improved with no increase in in-band tone.

While two capacitor elements c1 and c2 are used as the objects to be corrected in the illustrated example, the number of capacitor elements to be corrected is not limited to two. When the number of capacitor elements to be corrected is changed, the configuration may be as follows. Variable capacitor elements of the same number as the number of capacitor elements to be corrected in the higher-order DAC 21A may be provided in the lower-order DAC 22A, and such variable capacitor elements may be controlled in association with the control of the corresponding capacitor elements to be corrected. ΔΣ modulators may be individually provided for the variable capacitor elements, to control the capacitance values of the variable capacitor elements with signals output from the corresponding ΔΣ modulators.

While the capacitance DAC 2A is divided into the higher-order DAC and the lower-order DAC in FIG. 5, the configuration is not limited to this for the mismatch error correction of the capacitor elements. In other words, even a configuration with no division into higher-order part and lower-order part can also obtain the advantage according to this embodiment. That is, while correction control signals are being supplied to some capacitor elements of the capacitance DAC from the capacitance DAC control circuit, the other capacitor elements of the capacitance DAC may be operated. Based on AD converted values obtained by this operation, the capacitance values of the variable capacitor elements may be determined.

<Weighting Error Correction Between Higher-Order DAC and Lower-Order DAC>

First, as the initial state, the capacitance value of the coupling capacitor ca is set to a value sufficiently larger than 2C that is an ideal capacitance value when no parasitic capacitance is present in the lower-order DAC 22A. Also, the signal tc3 is set to "0" to set the capacitance value of the variable capacitor element vca to 0, to ensure that the capacitance value of the lower-order DAC 22A be smaller than that of the higher-order DAC 21A even if a parasitic capacitance is present in the lower-order DAC 22A.

To correct a weighting error between the higher-order DAC 21A and the lower-order DAC 22A, setting may be made so that an AD converted value Voff obtained when only the lower-order DAC 22A is operated and an AD converted value Voffp or Voffn by the lower-order DAC 22A obtained when the lowest-order bit of the higher-order DAC 21A is forcibly operated depending on the sign of Voff satisfy Voff=Voffp or Voff=Voffn. By this setting, the higher-order part and the lower-order part are coupled continuously, providing linear AD conversion characteristics.

In the successive approximation AD converter according to this embodiment, the AD converted values Voff, Voffp, and Voffn are measured in the following manner. First, the correction control circuit 13 controls the higher-order DAC control circuit 12 to allow the correction control signals TM1 to TM4 to be input into the higher-order DAC 21A, and fixes the correction control signals TM1 to TM5 to (1, 0, 0, 0, 0) or (0, 1, 1, 1, 1). Also, the switch 1 is closed to sample the input center voltage as the analog input voltage VIN.

After the sampling of the input center voltage, the switch 1 is opened, and normal successive approximation operation is performed with only the lower-order DAC 22A while the digital input into the higher-order DAC 21A is kept fixed. Voff can be measured from the serial-to-parallel converted lower-order bits obtained when the successive approximation operation has been finished down to the lowest-order bit. The resultant value of Voff will be 0 when the comparator 3 is in its ideal state. However, since there is an offset in the comparator 3, the value of Voff is a value of the offset of the comparator 3 represented by a digital value.

Thereafter, Voffp, when the sign of the measured Voff is positive, or Voffn, when it is negative, is measured. As in the measurement of Voff, first, the correction control circuit 13 controls the higher-order DAC control circuit 12 to allow the correction control signals TM1 to TM4 to be input into the higher-order DAC 21A, and fixes the correction control signals TM1 to TM5 to (0, 1, 1, 1, 1) for measurement of Voffp or to (1, 0, 0, 0, 0) for measurement of Voffn. Also, the switch 1 is closed to sample the input center voltage as the analog input voltage VIN.

The switch 1 is then opened, and TM5 is changed from "1" to "0" for measurement of Voffp, or from "0" to "1" for measurement of Voffn, and normal successive approximation operation is performed with only the lower-order DAC 22A. In place of changing TM5, TM4 may be changed. Voffp or Voffn can be measured from the serial-to-parallel converted lower-order bits after the approximation operation has been finished down to the lowest-order bit.

When Voffp>Voff or Voffn<Voff, this indicates that the weighting of the lower-order DAC 22A is larger than that of the higher-order DAC 21A. In this case, the signal tc3 is increased to increase the capacitance value of the variable capacitor element vca. At this time, since the weighting of the lower-order DAC 22 changes, it is necessary to measure Voff again. Thus, measurement of Voff and measurement of Voffp or Voffn depending on the sign of Voff are repeated, with the signal tc3 being increased, until Voffp=Voff or Voffn=Voff is satisfied. Once Voffp=Voff or Voffn=Voff is satisfied, the weighting becomes even over the higher-order DAC 21A and the lower-order DAC 22A, achieving linear AD conversion characteristics.

In this embodiment, the $\Delta\Sigma$ modulator 7c is used for adjustment of the signal tc3. The correction control circuit 13 outputs the digital value dc3 to the $\Delta\Sigma$ modulator 7c as the capacitance value control signal corresponding to the corrected value of the weighting of the lower-order DAC 22A. The $\Delta\Sigma$ modulator 7c achieves a capacitance value for the variable capacitor element vca finer than the adjustment resolution of the element vca using the occurrence probability of the 0, 1 pattern of the $\Delta\Sigma$ modulated signal tc3. In this way, the weighting error between the higher-order DAC and the lower-order DAC can be corrected more precisely using the variable capacitor element vca of the lower-order DAC 22A.

While the resolution of AD conversion is eight bits in the above embodiments, the disclosure is not limited to this. The number of capacitor elements in the capacitance DAC 2 or 2A may be appropriately increased or decreased to obtain an arbitrary resolution.

The capacitor elements c1 to c8 may be so-called split capacitors. For example, the capacitor element c1 having a capacitance value of 8C may be configured using two capacitor elements each having a capacitance value of 4C where one terminal is connected to the common node and either the reference voltage VH or VL is selectively applied to the other terminal (see U.S. Pat. No. 7,898,453, for example).

While the configuration of sampling the analog input voltage VIN to the common node of the capacitance DAC 2 or 2A has been described as an example in the above embodiments, the disclosure is not limited to this. For example, the analog input voltage may be connected to one input of the comparator, and the common node of the capacitance DAC may be connected to the other input thereof. Alternatively, the analog input voltage may be selectively input into the second terminals of the capacitor elements of the capacitance DAC to which the reference voltage VH or VL is supplied.

While the capacitance values of the capacitor elements c1 to c8 are weighted with a binary ratio in the above embodiments, the disclosure is not limited to this. For example, a successive approximation AD converter where the capacitance values are weighted with a ratio smaller than 2 is widely known. The present disclosure is also applicable to such an AD converter, and a similar advantage can be obtained.

The successive approximation AD converter according to the present disclosure can achieve high-precision AD conversion while using small-area, low-power analog circuits, and thus is useful for video signal processing apparatuses and wireless apparatuses.

What is claimed is:

1. A successive approximation AD converter configured to convert an analog input voltage to a digital value, comprising:
    a capacitance DAC having a plurality of capacitor elements having weighted capacitance values, first terminals of the capacitor elements being connected to a common node and either a first or second reference voltage being selectively applied to second terminals thereof according to a first digital signal;
    a comparator at least having an input connected to the common node of the capacitance DAC, configured to compare the analog input voltage with a comparison-target voltage generated by the capacitance DAC;
    a successive approximation control section configured to set a second digital signal for generating the comparison-target voltage for the next bit from the comparison result of the comparator and output the second digital signal;
    a noise generator having at least one $\Delta\Sigma$ modulator, configured to output an output of the $\Delta\Sigma$ modulator as a noise signal; and
    a selector circuit provided for at least one of the plurality of capacitor elements, configured to select either the second digital signal or the noise signal for the capacitor element and output the selected signal as the first digital signal.

2. The successive approximation AD converter of claim 1, wherein the selector circuit selects, as the first digital signal, the noise signal during sampling of the analog input voltage and the second digital signal after the sampling.

3. The successive approximation AD converter of claim 1, further comprising:
    a subtraction circuit configured to subtract a digital value corresponding to the noise signal from a multi-bit digital value converted from the output of the comparator.

4. The successive approximation AD converter of claim 1, further comprising:
    a digital filter circuit configured to remove an out-of-band signal from a multi-bit digital value converted from the output of the comparator.

5. The successive approximation AD converter of claim 1, wherein
    the noise generator has a plurality of $\Delta\Sigma$ modulators, and
    the plurality of $\Delta\Sigma$ modulators are configured to output digital signals uncorrelated to each other.

6. A successive approximation AD converter configured to convert an analog input voltage to a digital value, comprising:
    a capacitance DAC having a plurality of capacitor elements having weighted capacitance values, first terminals of the capacitor elements being connected to a common node and either a first or second reference voltage being selectively applied to second terminals thereof according to a first digital signal;
    a comparator at least having an input connected to the common node of the capacitance DAC, configured to compare the analog input voltage with a comparison-target voltage generated by the capacitance DAC;
    a successive approximation control section configured to set a second digital signal for generating the comparison-target voltage for the next bit from the comparison result of the comparator and output the second digital signal;
    a capacitance DAC control circuit configured to select either a correction control signal or the second digital signal and output the selected signal to the capacitance DAC as the first digital signal; and
    a $\Delta\Sigma$ modulator configured to receive a capacitance value control signal,
    wherein the capacitance DAC has at least one variable capacitor element where a first terminal thereof is connected to the common node, either the first or second reference voltage is selectively applied to a second terminal thereof according to a bit as part of the second digital signal, and the capacitance value is controlled according to an output signal of the ΔΣ modulator.

7. The successive approximation AD converter of claim 6, further comprising:
a digital filter circuit configured to remove an out-of-band signal from a multi-bit digital value converted from the output of the comparator.

8. The successive approximation AD converter of claim 6, further comprising:
a correction control circuit configured to receive a multi-bit digital value converted from the output of the comparator and generate the correction control signal and the capacitance value control signal.

9. A successive approximation AD converter configured to convert an analog input voltage to a digital value, comprising:
a capacitance DAC having a plurality of capacitor elements having weighted capacitance values, first terminals of the capacitor elements being connected to a common node and either a first or second reference voltage being selectively applied to second terminals thereof according to a first digital signal, the capacitance DAC being divided into a higher-order DAC including capacitor elements corresponding to higher-order bits of the digital value and a lower-order DAC including capacitor elements corresponding to lower-order bits of the digital value, a coupling capacitor being inserted between the higher-order DAC and the lower-order DAC at the common node;
a comparator at least having an input connected to the common node of the capacitance DAC, configured to compare the analog input voltage with a comparison-target voltage generated by the capacitance DAC;
a successive approximation control section configured to set a second digital signal for generating the comparison-target voltage for the next bit from the comparison result of the comparator and output the second digital signal;
a higher-order DAC control circuit configured to select either a correction control signal or the second digital signal and output the selected signal to the higher-order DAC as the first digital signal; and
a ΔΣ modulator configured to receive a capacitance value control signal,
wherein the lower-order DAC has a variable capacitor element where a first terminal thereof is connected to the common node, a second terminal thereof is grounded, and the capacitance value is controlled according to an output signal of the ΔΣ modulator.

10. The successive approximation AD converter of claim 9, further comprising:
a digital filter circuit configured to remove an out-of-band signal from a multi-bit digital value converted from the output of the comparator.

11. The successive approximation AD converter of claim 9, further comprising:
a correction control circuit configured to receive a multi-bit digital value converted from the output of the comparator and generate the correction control signal and the capacitance value control signal.

12. A noise generator having a plurality of ΔΣ modulators, configured to supply output signals of the plurality of ΔΣ modulators as noise signals,
wherein the noise signals are signals obtained by individually adding differently-weighted values to the output signals of the ΔΣ modulators, and
the differently-weighted values are based on a binary ratio.

13. A noise generator having a plurality of ΔΣ modulators, configured to supply output signals of the plurality of ΔΣ modulators as noise signals,
wherein the noise signals are signals obtained by individually adding differently-weighted values to the output signals of the ΔΣ modulators, and
the plurality of ΔΣ modulators are different in order from each other.

* * * * *